(12) United States Patent
Moon et al.

(10) Patent No.: US 8,278,158 B2
(45) Date of Patent: Oct. 2, 2012

(54) THIN FILM TRANSISTOR SUBSTRATE, METHOD OF MANUFACTURING THE SAME, AND DISPLAY APPARATUS HAVING THE SAME

(75) Inventors: Sang-Ho Moon, Seoul (KR); Joon-Hoo Choi, Seoul (KR); Kyu-Sik Cho, Suwon-si (KR); Byoung-Seong Jeong, Yongin-si (KR); Yong-Hwan Park, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 464 days.

(21) Appl. No.: 12/554,153

(22) Filed: Sep. 4, 2009

(65) Prior Publication Data
US 2010/0090208 A1 Apr. 15, 2010

(30) Foreign Application Priority Data
Sep. 4, 2008 (KR) .......................... 10-2008-0087454

(51) Int. Cl.
*H01L 21/00* (2006.01)

(52) U.S. Cl. .................... 438/149; 438/158; 257/E21.41
(58) Field of Classification Search .................. 438/149, 438/158; 257/E21.41
See application file for complete search history.

(56) References Cited

U.S. PATENT DOCUMENTS

| 4,997,262 | A | * | 3/1991 | Sakono et al. | ................ 349/147 |
| 5,462,891 | A | * | 10/1995 | Okada | ............................ 438/669 |
| 5,742,365 | A | * | 4/1998 | Seo | ................................. 349/43 |
| 2003/0080436 | A1 | * | 5/2003 | Ishikawa | ....................... 257/776 |

* cited by examiner

*Primary Examiner* — Thanh V Pham
(74) *Attorney, Agent, or Firm* — F. Chau & Associates, LLC (57) ABSTRACT

In a method of manufacturing a thin film transistor substrate, a semiconductor pattern is formed on a substrate, a first etch stop layer and a second etch stop layer are sequentially formed on the semiconductor pattern, and the second etch stop layer and the first etch stop layer are sequentially patterned to form a second etch stop pattern and a first etch stop pattern. Thus, when the second etch stop layer is patterned using an etchant, the first etch stop layer covers the semiconductor pattern, thereby preventing the semiconductor pattern from being etched by the etchant.

16 Claims, 8 Drawing Sheets

THIN FILM TRANSISTOR SUBSTRATE, METHOD OF MANUFACTURING THE SAME, AND DISPLAY APPARATUS HAVING THE SAME

CROSS-REFERENCE TO RELATED APPLICATION

This application claims priority from Korean Patent Application No. 2008-87454 filed on Sep. 4, 2008, the disclosure of which is hereby incorporated by reference herein in its entirety.

BACKGROUND

1. Technical Field

The present disclosure relates to a thin film transistor substrate capable of improving its switching characteristics, a method of manufacturing the thin film transistor substrate, and to a display apparatus having the thin film transistor substrate.

2. Description of the Related Art

A thin film transistor substrate may include a substrate and a thin film transistor formed on the substrate. The thin film transistor may switch signals applied through wires that are arranged on the substrate.

In general, the thin film transistor typically includes a gate electrode, a source electrode, a drain electrode, and a semiconductor pattern. The thin film transistor may further include an etch stop pattern arranged on the semiconductor pattern to cover a channel part of the semiconductor pattern. The etch stop layer pattern may prevent the channel part from being etched while other layers are on the semiconductor pattern, thereby preventing deterioration of the switching characteristic of the thin film transistor.

Meanwhile, the etch stop pattern may be formed by forming an etch stop layer on the semiconductor pattern and etching the etch stop layer. However, when the etch stop layer is etched using an etchant, defects may occur in the channel part, and thus the switching characteristic of the thin film transistor may be deteriorated.

Thus, there is a need in the art for a thin film transistor substrate having improving switching characteristics and for a method for manufacturing the same.

SUMMARY

An exemplary embodiment of the present invention may provide a thin film transistor substrate capable of improving its switching characteristics.

Another exemplary embodiment of the present invention may also provide a method of manufacturing the thin film transistor substrate.

Another exemplary embodiment of the present invention may also provide a display apparatus having the thin film transistor substrate.

In accordance with an exemplary embodiment of the present invention, a thin film transistor substrate is provided. The thin film transistor substrate includes a substrate, a gate electrode arranged on the substrate. The thin film transistor further includes a semiconductor pattern arranged on the gate electrode, and the semiconductor pattern including a source area, a drain area, and a channel area.

Also, the thin film transistor substrate further includes a first etch stop pattern arranged on the semiconductor pattern to cover the channel area, a second etch stop pattern arranged on the first etch stop pattern, a source electrode arranged on the semiconductor pattern in the source area, and a drain electrode arranged on the semiconductor pattern in the drain area and spaced apart from the source electrode.

In accordance with another exemplary embodiment of the present invention, a method of manufacturing a thin film transistor substrate is provided. The method includes forming a gate electrode on a substrate, and a semiconductor pattern including a source area, a drain area, and a channel area on the gate electrode. The method further includes forming a first etch stop layer on the semiconductor pattern, and a second etch stop layer on the first etch stop layer. The method further includes etching the second etch stop layer to form a second etch stop pattern that overlaps the channel area, patterning the first etch stop layer to form a first etch stop pattern that covers the channel area under the second etch stop pattern and forming a source electrode and a drain electrode spaced apart from each other in the source area and the drain area, respectively.

In accordance with another exemplary embodiment of the present invention, a display apparatus is provided. The display apparatus includes a first substrate including a display area, a second substrate facing the first substrate, a plurality of pixels arranged on the first substrate in the display area, and a thin film transistor arranged on the first substrate to switch a data signal applied to each pixel.

The thin film transistor includes a gate electrode arranged on the first substrate, a semiconductor pattern that is arranged on the gate electrode and includes a source area, a drain area, and a channel area, a first etch stop pattern arranged on the semiconductor pattern to cover the channel area, a second etch stop pattern that is arranged on the first etch stop pattern and includes different material from the first etch stop pattern, a source electrode arranged on the semiconductor pattern in the source area, and a drain electrode arranged on the semiconductor pattern in the drain area and spaced apart from the source electrode.

According to the above exemplary embodiments, the thin film transistor substrate may improve its switching characteristics.

BRIEF DESCRIPTION OF THE DRAWINGS

The Exemplary embodiments of the present invention can be understood in more detail from the following description when considered in conjunction with the accompanying drawings wherein.

DESCRIPTION OF THE EXEMPLARY EMBODIMENTS OF THE INVENTION

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1A:
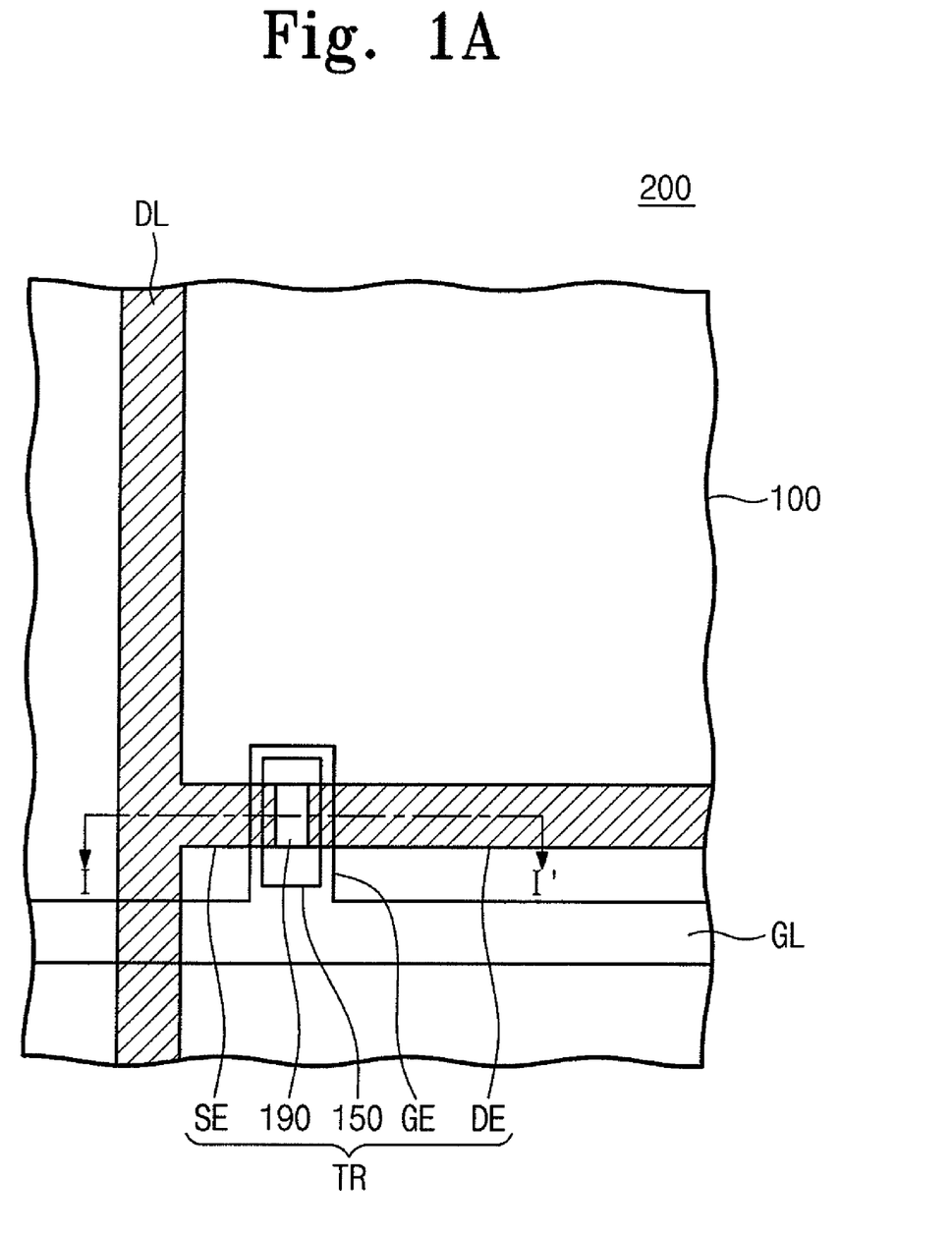
FIG. 1A is a plan view showing an exemplary embodiment of a thin film transistor substrate according to the present invention.
Figure 1B:
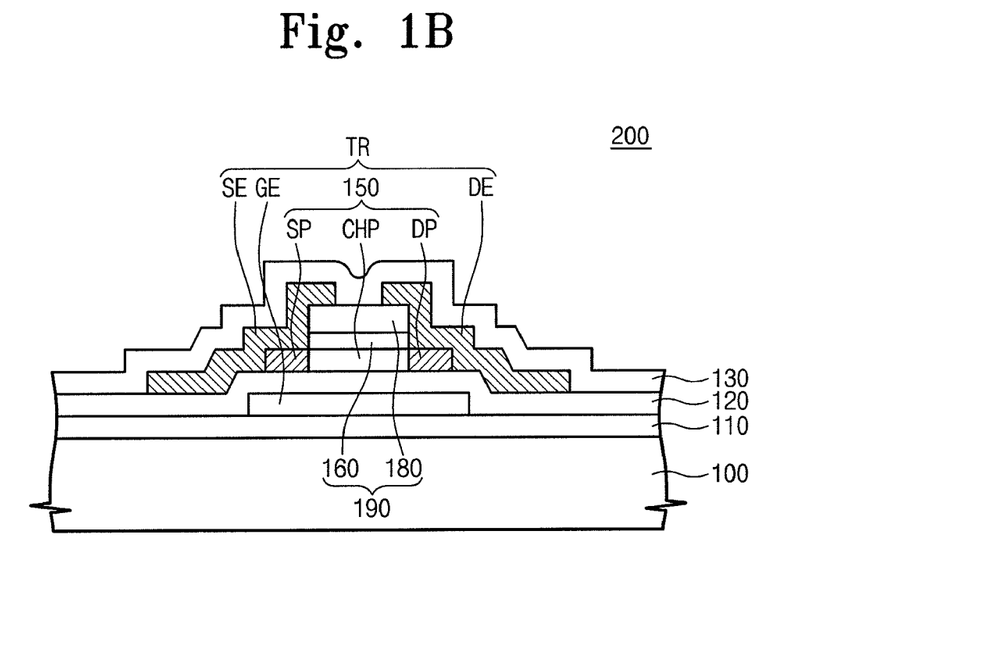
FIG. 1B is a cross-sectional view taken along a line I-I' of FIG. 1A.

FIG. 1A is a plan view showing an exemplary embodiment of a thin film transistor substrate according to the present invention, and FIG. 1B is a cross-sectional view taken along a line I-I' of FIG. 1A.

Referring to FIGS. 1A and 1B, a thin film transistor substrate 200 includes a base substrate 100, a blocking layer 110, a gate insulating layer 120, a gate line GL, a data line DL, a thin film transistor TR, and an inter-insulating layer 130 covering the thin film transistor TR.

The blocking layer 110 is arranged on an entire surface of the base substrate 100. The blocking layer 110 includes an insulating material, such as, for example, silicon oxide or silicon nitride. The blocking layer 110 is applied to the thin film transistor substrate 200 for various purposes, and one of the various purposes is to prevent ions eluted from the base substrate 100 from being diffused around the base substrate 100.

The gate line GL extends in one direction to be arranged on the base substrate 100 and transmits a gate signal to turn on the thin film transistor TR. The data line DL is insulated from the gate line GL by the gate insulating layer 120, and the data line DL extends in a direction that is substantially perpendicular to that of the gate line GL to be arranged on the base substrate 100. Also, the data line DL transmits a data signal applied to a drain electrode when the thin film transistor TR is turned on.

The thin film transistor TR includes a gate electrode GE, a source electrode SE, the drain electrode DE, etch stop patterns 190, and a semiconductor pattern 150. The gate electrode GE is arranged on the blocking layer 110 and branches from the gate line GL. In addition, the gate insulating layer 120 is arranged on the gate electrode GE to cover the gate electrode GE.

The semiconductor pattern 150 is arranged on the gate insulating layer 120 to face the gate electrode GE. The semiconductor pattern 150 includes a source contact part SP, a drain contact part DP, and a channel part CHP. The source contact part SP is a portion of the semiconductor pattern 150 and makes contact with the source electrode SE. Also, the drain contact part DP is a portion of the semiconductor pattern 150 and makes contact with the drain electrode DE. The channel part CHP is arranged between the source contact part SP and the drain contact part DP, and the channel part CHP electrically connects the source electrode SE and the drain electrode DE when the thin film transistor TR is turned on.

To reduce a contact resistance between the source contact part SP and the source electrode SE, the source contact part SP may be doped with impurities, such as, for example, boron ions, phosphor ions. Also, similar to that in the source contact part SP, the drain contact part DP may be doped with the impurities to reduce the contact resistance between the drain contact part DP and the drain electrode DE.

Meanwhile, unlike the present exemplary embodiment, an ohmic contact pattern into which ions are injected may be arranged on the semiconductor pattern 150. In the case that the ohmic contact pattern is arranged on the semiconductor pattern 150, the ohmic contact pattern may be interposed between the semiconductor pattern 150 and the source electrode SE to reduce the contact resistance between the semiconductor pattern 150 and the source electrode SE, and the ohmic contact pattern may be interposed between the semiconductor pattern 150 and the drain electrode De to reduce the contact resistance between the semiconductor pattern 150 and the drain electrode DE.

The etch stop patterns 190 are arranged on the channel part CHP to cover the channel part CHP. The etch stop patterns 190 prevent the channel part CHP from being defected by an etchant that is used to manufacture the thin film transistor TR. The etch stop patterns 190 include a first etch stop pattern 160 and a second etch stop pattern 180 arranged on the first etch stop pattern 160.

The first etch stop pattern 160 may have a thickness different from the thickness of the second etch stop pattern 180, and the first etch stop pattern 160 and the second etch stop pattern 180 have the same shape in a plan view. For example, in the present exemplary embodiment, the first etch stop pattern 160 may have a thickness of about 150 angstroms to about 200 angstroms, and the second etch stop pattern 180 may have a thickness that is larger by about four times to about six times than that of the first etch stop pattern 160.

The first etch stop pattern 160 and the second etch stop pattern 180 include different materials from each other. For example, the first etch stop pattern 160 includes silicon oxide (SiOx), and the second etch stop pattern 180 includes silicon nitride (SiNx). The reason why the first and second etch stop patterns 160 and 180 include different materials from each other will be described with reference to FIGS. 2 to 8, as the reason is related to a manufacturing method of the thin film transistor TR.

FIGS. 2 to 8 are cross-sectional views illustrating a manufacturing process of the thin film transistor substrate of FIG. 1. In FIGS. 2 to 8, the same reference numerals denote the same elements in FIGS. 1A and 1B, and thus the detailed descriptions of the same elements will be omitted.

Figure 2:
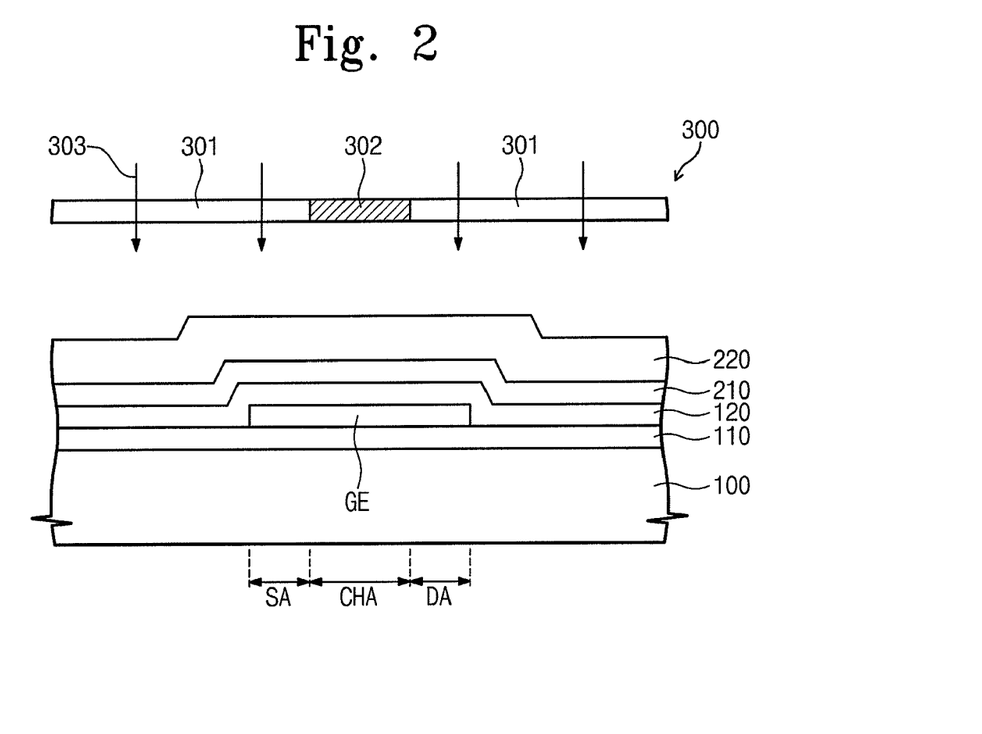
FIGS. 2 to 8 are cross-sectional views illustrating a manufacturing process of a thin film transistor substrate of FIG. 1.

Referring to FIG. 2, the blocking layer 110 is formed on the base substrate 100, and the gate electrode GE is formed on the blocking layer 110. After forming the gate electrode GE, the gate insulating layer 120, a preliminary semiconductor layer 210 including amorphous silicon, and a first photoresist layer 220 having a positive-type photoresist are sequentially formed.

After forming the first photoresist layer 220, a photomask 300 is arranged above the first photoresist layer 220. The photomask 300 includes a transmission region 301 transmitting a light and a non-transmission region 302 blocking the light, and is arranged such that the transmission region 301 faces a channel area CHA. After the photomask 300 is arranged on the first photoresist layer 220, the light 303 is irradiated onto the first photoresist after transmitting through the photomask 300.

After exposing the first photoresist layer 220 to the light 303 using the photomask 300, the first photoresist layer 220 is developed. Thus, a first photoresist layer pattern 221 (shown in FIG. 3) is formed on the preliminary semiconductor pattern 210 in the channel area CHA.

Figure 3:
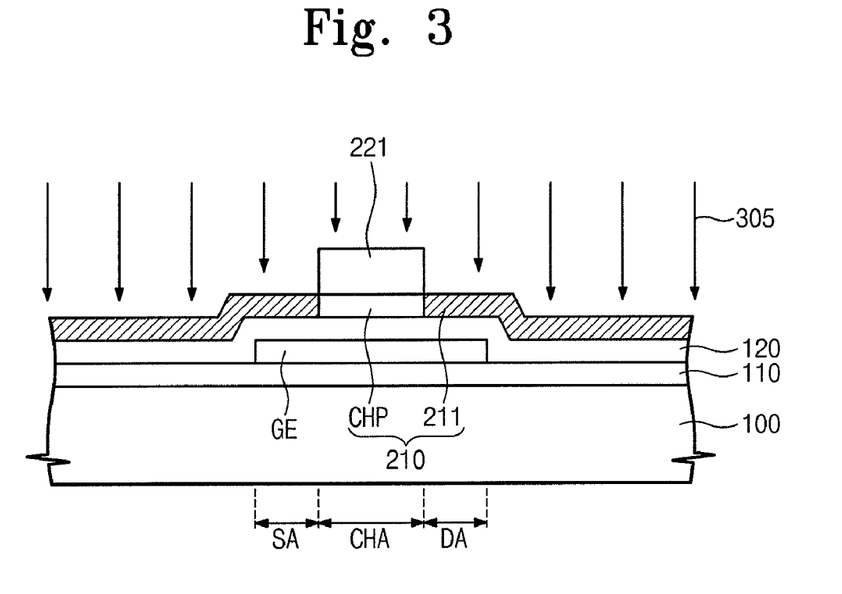
Figure 4:
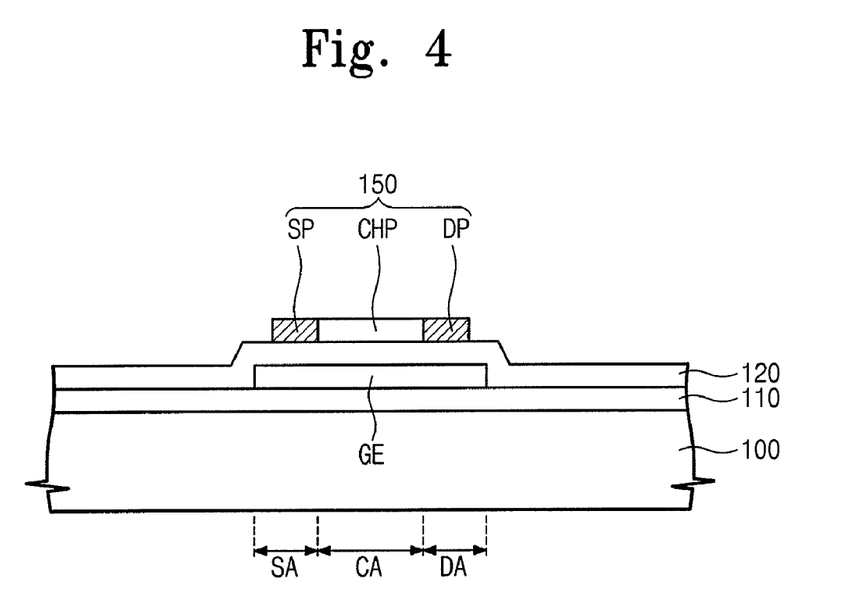

Referring to FIGS. 3 and 4, after forming the first photoresist layer pattern 221, ions 305 are injected into the preliminary semiconductor layer 210 using the first photoresist layer pattern 221 as a mask. As a result, the preliminary semiconductor layer 210 may be divided into the channel part CHP and an ion doped part 211 according to concentration level of the injected ions 305. For example, the ions 305 are not injected into the channel part CHP due to the first photoresist layer pattern 221, so that the concentration level of the ions 305 in the ion doped part 211 is higher than the concentration level of the ions 305 in the channel part CHP.

After injecting the ions 305 into the preliminary semiconductor layer 210, the preliminary semiconductor layer 210 is patterned to form the semiconductor pattern 150. The semiconductor pattern 150 includes the source contact part SP in a source area SA, the drain contact part DP in a drain area DA, and the channel part CHP in the channel area CA.

After forming the semiconductor pattern 150, a solid phase crystallization (SPC) process on the semiconductor pattern 150 is performed. The SPC process is applied to crystallize amorphous silicon at a temperature of, for example, over about 600° C. After the SPC process is completed, the semiconductor pattern 150 may be, for example, polysilicon.

Meanwhile, during the SPC process on the semiconductor pattern 150, a surface of the semiconductor pattern 150 is oxidized, so that a silicon oxide layer is formed on the surface of the semiconductor pattern 150. The silicon oxide layer is a by-product generated during the SPC process, and it is desirable to remove the silicon oxide layer.

In the present exemplary embodiment, when the silicon oxide layer is removed using an etchant, the silicon oxide layer may be, for example, wet-etched using an etchant containing hydrogen fluoride so that, except the silicon oxide layer, other layers, e.g. the semiconductor pattern 150, may be prevented from being damaged by the etchant. The etchant may contain, for example, about 0.1 percent by weight of hydrogen fluoride, and the wet-etch process may be performed, for example, for, about 180 seconds.

In general, the etchant is used to wash out a surface of a thin layer. However, the etchant may etch a silicon oxide layer. Thus, in the case that the silicon oxide layer is wet-etched using the etchant, not only the silicon oxide layer may be removed, but also surfaces of other layers may be prevented from being damaged.

Figure 5:
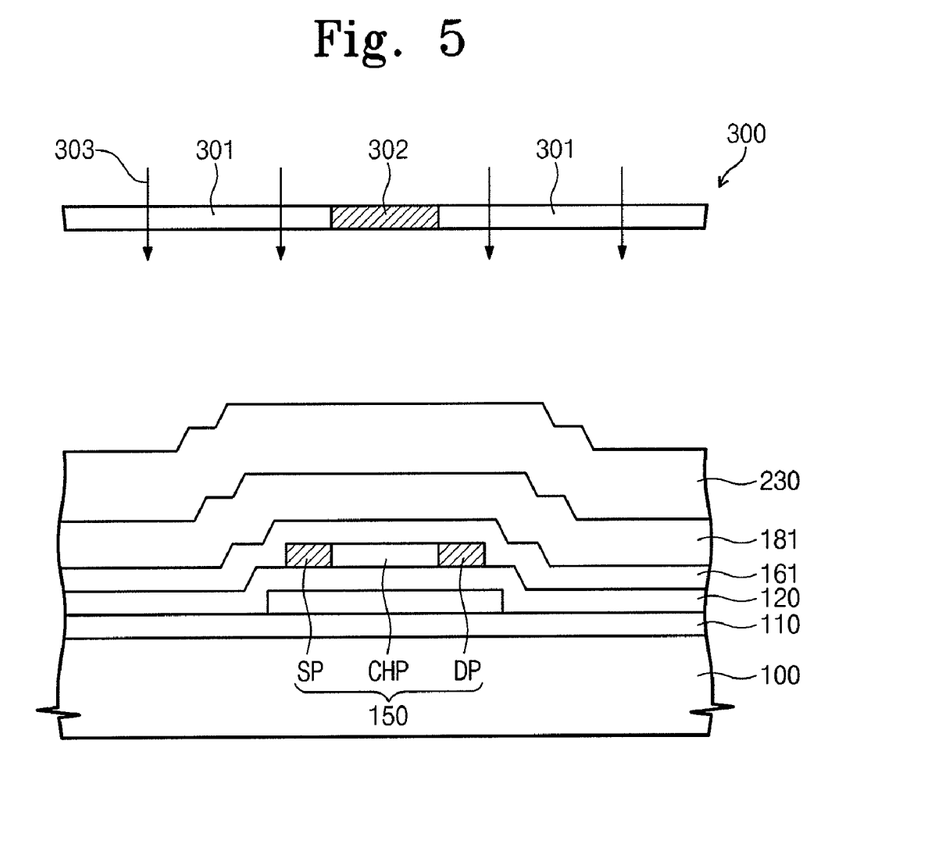
Figure 6:
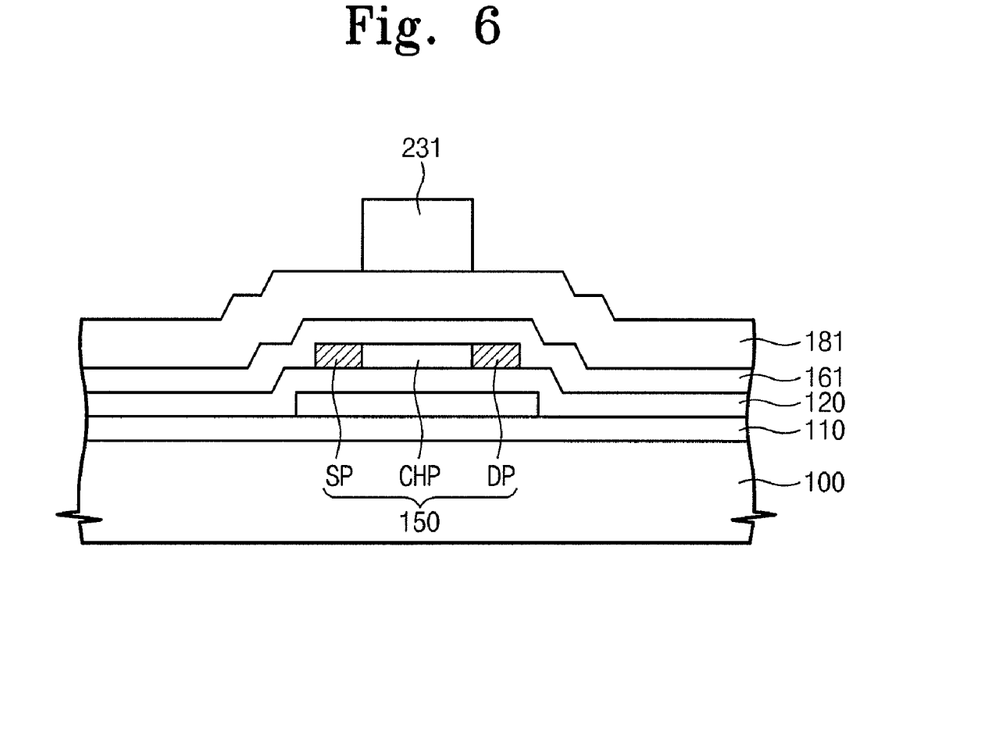

Referring to FIGS. 5 and 6, after forming the semiconductor pattern 150, a first etch stop layer 161, a second etch stop layer 181, and a second photoresist layer 230 having a positive-type photoresist are sequentially formed on the semiconductor pattern 150. The first etch stop layer 161 includes silicon oxide and has a thickness of about 200 angstroms. Also, the second etch stop layer 181 includes silicon nitride and has a thickness of about 1000 angstroms.

After forming the second photoresist layer 230, the photomask 300 is arranged above the second photoresist layer 230 such that the transmission region 302 faces the channel part CHP. The photomask 300 is the same as the photomask 300 of FIG. 2, which is used to pattern the first photoresist layer 220 shown in FIG. 2. After arranging the photomask 300 above the second photoresist layer 230, light 303 is irradiated onto the second photoresist 230 after transmitting through the photomask 300.

After exposing the second photoresist layer 230 to the light 303 using the photomask 300, the second photoresist layer 230 is developed to form a second photoresist layer pattern 231 that overlaps the channel part CHP in a plan view.

Figure 7:
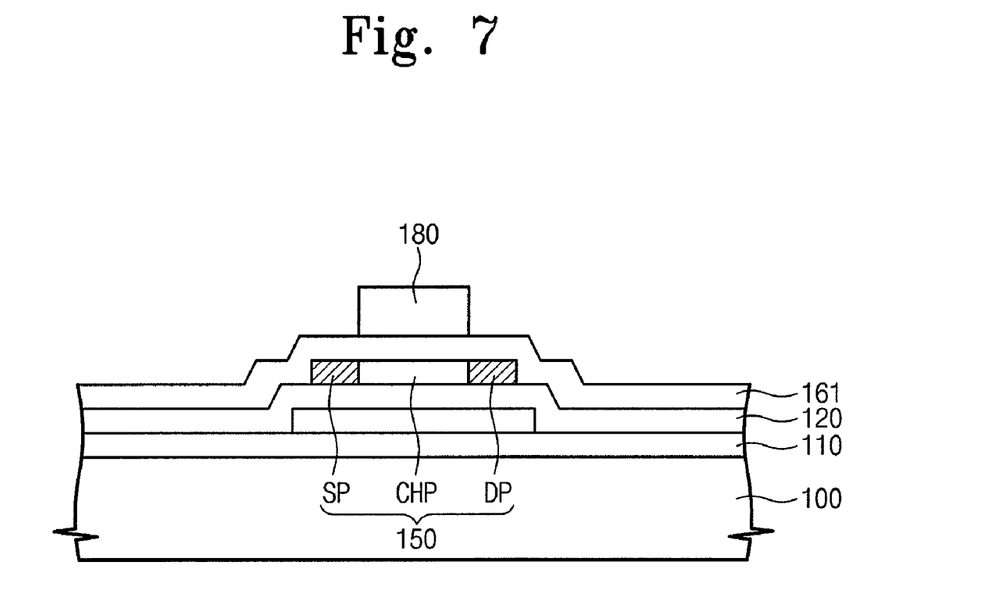

Referring to FIGS. 6 and 7, the second etch stop layer 181 is etched using the second photoresist layer pattern 231 as an etch mask to form the second etch stop pattern 180. The second etch stop layer 181 may be dry-etched using, for example, plasma. Meanwhile, while the second etch stop layer 181 is etched to pattern the second etch stop pattern 180, the first etch stop layer 161 is partially etched, thereby reducing the thickness of the first etch stop layer 161 by about 100 angstroms to about 150 angstroms. Thus, the first etch stop layer 161 has a thickness of about 50 angstroms to about 100 angstroms.

In general, the dry-etching method using plasma is widely used. However, when etching an object using plasma, except for the etch object, defects may occur on surfaces of other layers exposed to an exterior. As a result, when additional layers are added on the defected layers, adhesivity between layers may be deteriorated, and thus the layers may be separated from each other. However, in the present exemplary embodiment, when the second etch stop layer 181 is dry-etched using plasma, the first etch stop layer 161 is arranged under the second etch stop layer 181 to cover the other layers (e.g., the semiconductor pattern 150) arranged under the first etch stop layers 161. Thus, with the present exemplary embodiment, the surface of the other layers arranged under the first etch stop layer 161 including the semiconductor pattern 150 may be prevented from being defected.

Figure 8:
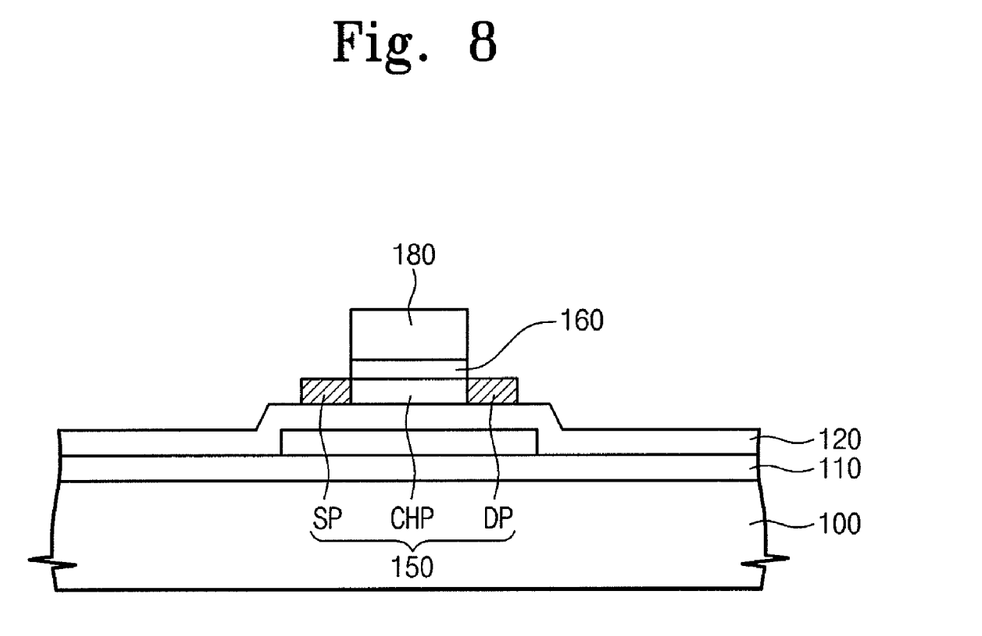

Referring to FIGS. 7 and 8, after forming the second etch stop pattern 180, the first etch stop layer 161 is wet-etched using the second etch stop pattern 180 as an etch mask to form the first etch stop pattern 160.

An etchant containing, for example, hydrogen fluoride HF is used for the wet-etching process. In the present exemplary embodiment, the etchant used in the wet-etching process includes, for example, about 0.5 percent by weight of hydrogen fluoride, and the wet-etching process is performed, for example, for about 120 seconds. Meanwhile, as described above, as the thickness of the first etch stop layer 161 is reduced by about 100 angstroms to about 150 angstroms while the second etch stop pattern 180 is formed, the first etch stop layer 161 may be readily patterned according to the wet-etching process satisfying the above mentioned conditions.

Also, the etchant containing about 0.5 percent by weight of hydrogen fluoride may etch silicon oxide, but may not etch silicon nitride. Therefore, the etchant may etch the first etch stop layer 161, but the second etch stop pattern 180 including silicon nitride may not be etched by the etchant. Thus, when the first etch stop layer 161 is wet-etched, the second etch stop pattern 180 may serve as the etch mask.

In addition, a purpose of the wet-etching process is to pattern the first etch stop layer 161. However, after the first etch stop pattern 160 is formed, the remaining silicon oxide layer on a surface of the source contact part SP and the drain contact part CP that are exposed to an exterior may be removed through the wet-etching process.

Referring to FIG. 2, after forming the first etch stop pattern 160, the source electrode SE is formed on the source contact part SP, and the drain electrode DE is formed on the drain contact part DP. The source electrode SE and the drain electrode DE are formed to complete the thin film transistor TR, and the inter-insulating layer 130 covering the thin film transistor TR is formed to complete the thin film transistor substrate 200 having the thin film transistor TR.

Figure 9:
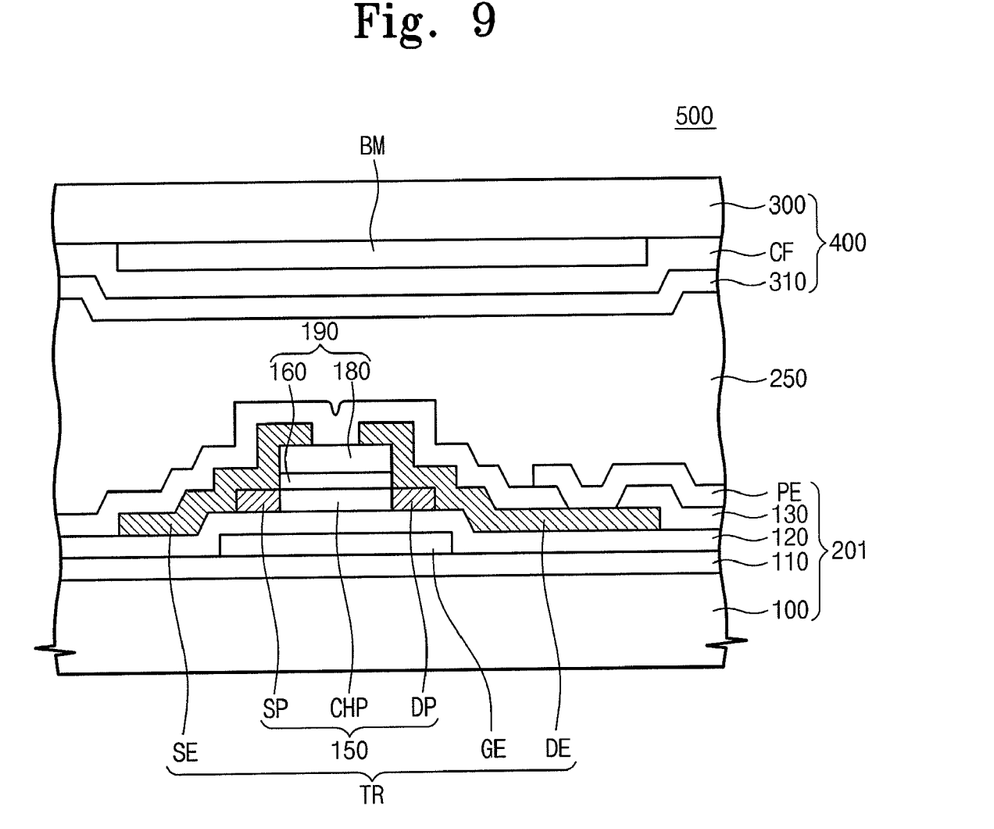
FIG. 9 is a sectional view showing an exemplary embodiment of a liquid crystal display according to the present invention.

FIG. 9 is a cross-sectional view showing an exemplary embodiment of a liquid crystal display according to the present invention. In FIG. 9, only one pixel arranged in the liquid crystal display is illustrated to depict its structure as pixels for the liquid crystal display have the same function and structure.

In FIG. 9, the same reference numerals denote the same elements in FIGS. 1 to 8, and thus the detailed descriptions of the same elements will be omitted.

Referring to FIG. 9, a liquid crystal display 500 includes a thin film transistor substrate 201, a color filter substrate 400, and a liquid crystal 250 interposed between the thin film transistor substrate 201 and the color filter 400.

The thin film transistor substrate 201 includes a thin film transistor TR and a pixel electrode PE that is electrically connected to the thin film transistor TR. The pixel electrode PE is electrically connected to a drain electrode DE of the thin film transistor TR. The thin film transistor TR has the same structure as that of the thin film transistor TR of FIG. 1 except that an inter-insulating layer 130 is partially removed to electrically connect the pixel electrode PE and the drain electrode DE, and thus the detailed description of the thin film transistor TR will be omitted.

Also, in the present exemplary embodiment, a gate line electrically connected to a gate electrode GE to transmit a gate signal and a data line electrically connected to a source electrode SE to transmit a data signal may be arranged on a base substrate 100. When the thin film transistor TR is turned on by the gate signal, the data signal is transmitted to the pixel electrode PE.

The color filter substrate 400 faces the thin film transistor substrate 201. The color filter substrate 400 includes an upper base substrate 300, a black matrix BM, a color filter CF, and a common electrode 310. The black matrix BM is arranged on the upper base substrate 300 to face the thin film transistor TR, and the color filter CF is arranged on the upper base substrate 300 to cover the black matrix BM. Also, the common electrode 310 is arranged on the color filter CF to face the pixel electrode PE. The common electrode 310 forms an electric field with the pixel electrode PE to control an alignment of the liquid crystal 250.

Figure 10:
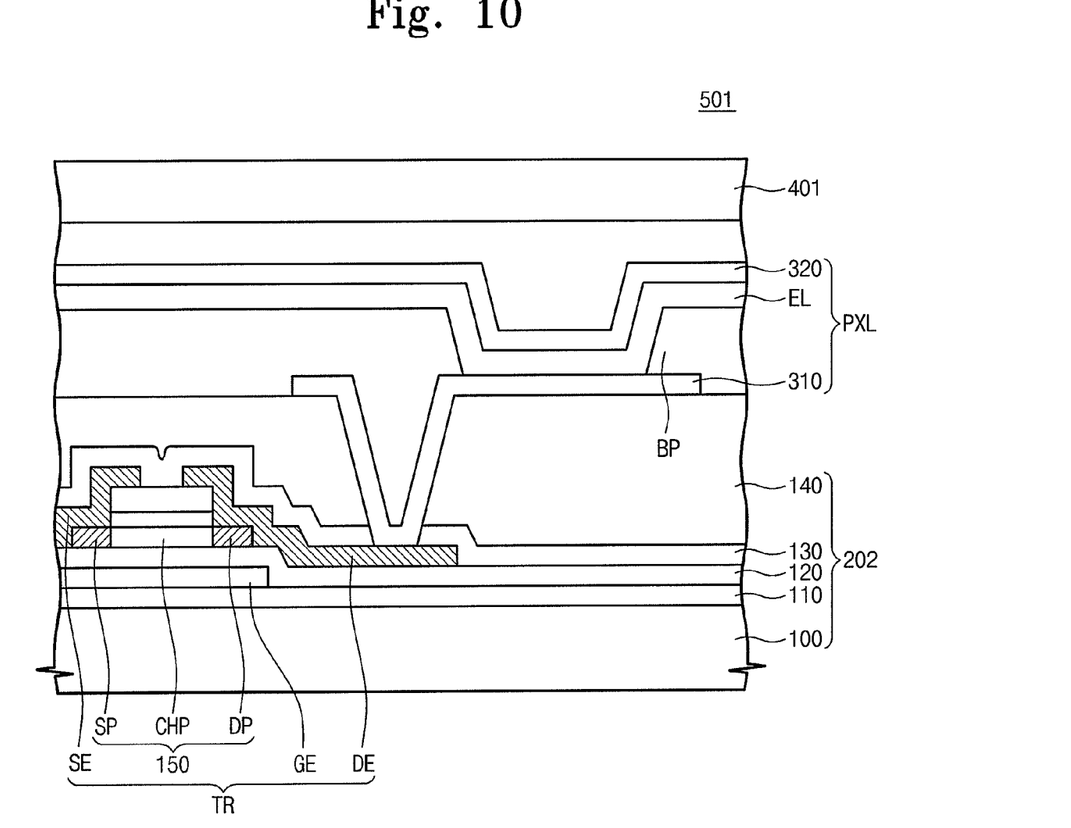
FIG. 10 is a sectional view showing an exemplary embodiment of an organic light emitting display according to the present invention.

FIG. 10 is a cross-sectional view showing an exemplary embodiment of an organic light emitting display according to the present invention. In FIG. 10, only one pixel arranged in the liquid crystal display is illustrated to depict its structure as pixels for the liquid crystal display have the same function and structure.

In FIG. 10, the same reference numerals denote the same elements in FIGS. 1 to 8, and thus the detailed descriptions of the same elements will be omitted.

Referring to FIG. 10, the organic light emitting display 501 includes a thin film transistor substrate 202 and an opposite substrate 401 facing the thin film transistor 202.

The thin film transistor substrate 202 includes a thin film transistor TR, a pixel PXL that is electrically connected to a drain electrode DE of the thin film transistor TR, an over-coat layer 140, and a bank pattern BP. The thin film transistor TR has the same structure as the thin film transistor TR of FIG. 1 except that an inter-insulating layer 130 is partially removed to electrically connect the pixel electrode PE and the drain electrode DE, and thus the detailed description of the thin film transistor TR will be omitted The over-coat layer 140 is arranged on the inter-insulating layer 130 to cover the thin film transistor TR. Also, the pixel PXL includes a first electrode 310, an organic light emitting layer EL, and a second electrode 320, and the first electrode 310 is electrically connected to a drain electrode DE of the thin film transistor TR through an area where the inter-insulating layer 130 and the over-coat layer 140 are partially removed.

The organic light emitting layer EL are arranged on the first electrode 310, and the second electrode 320 is arranged on the organic light emitting layer EL. Therefore, the organic light emitting layer EL may emit light using current transmitted through the first electrode 310 and the second electrode 320.

According to the above exemplary embodiments, the thin film transistor substrate may improve its switching characteristics.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a thin film transistor substrate, comprising:
   forming a gate electrode on a substrate;
   forming a semiconductor pattern including a source area, a drain area, and a channel area on the gate electrode;
   forming a first etch stop layer on the semiconductor pattern;
   forming a second etch stop layer on the first etch stop layer;
   etching the second etch stop layer to form a second etch stop pattern that overlaps the channel area;
   patterning the first etch stop layer to form a first etch stop pattern that covers the channel area under the second etch stop pattern; and
   forming a source electrode and a drain electrode spaced apart from each other in the source area and the drain area, respectively, wherein the source electrode is in direct contact with a lateral sidewall of the source area and an upper surface of the source area and wherein the drain electrode is in direct contact with a lateral sidewall of the drain area and an upper surface of the drain area.

2. The method of claim 1, wherein each of the first etch stop layer and the first etch stop pattern comprises silicon oxide, and each of the second etch stop layer and the second etch stop pattern comprises silicon nitride.

3. The method of claim 2, wherein the first etch stop layer is patterned by a wet etching process using an etchant containing hydrogen fluoride.

4. The method of claim 3, wherein the wet etching process is performed using the second etch stop pattern as an etch mask.

5. The method of claim 1, wherein the forming of the semiconductor pattern further comprises:
   forming a preliminary semiconductor layer on the gate electrode;
   forming a first photoresist layer on the preliminary semiconductor layer;
   exposing the first photoresist layer to a light using a photomask;
   developing the first photoresist layer exposed to the light to form a first photoresist layer pattern that overlaps the channel area in a plan view; and
   injecting ions into the source area and the drain area using the first photoresist layer pattern as a mask.

6. The method of claim 5, wherein the forming of the second etch stop pattern comprises:
   forming a second photoresist layer on the second etch stop layer;
   exposing the second photoresist layer to a light using the photomask;
   developing the second photoresist layer exposed to the light to form a second photoresist layer pattern that overlaps the channel area in a plan view; and
   etching the second etch stop layer using the second photoresist layer pattern as an etch mask.

7. The method of claim 6, wherein the second etch stop layer is dry etched.

8. The method of claim 1, wherein the forming of the semiconductor pattern comprises:
   forming a preliminary semiconductor layer including amorphous silicon on the gate electrode;
   performing a crystallization process on the preliminary semiconductor layer to form a semiconductor layer including polysilicon; and
   removing an oxide layer formed on a surface of the semiconductor layer.

9. The method of claim 8, wherein the oxide layer is removed using an etchant containing hydrogen fluoride.

10. The method of claim 1, wherein the source electrode is in direct contact with substantially the entire upper surface of the source area and wherein the drain electrode is in direct contact with substantially the entire upper surface of the drain area.

11. The method of claim 1, wherein the first etch stop pattern, the second etch stop pattern and the channel area fully overlap with each other.

12. The method of claim 1, further comprising forming a blocking layer directly on the substrate prior to forming the gate electrode and wherein the gate electrode is formed on the blocking layer.

13. The method of claim 12, further comprising forming a gate insulating layer on the gate electrode and the blocking layer prior to forming the semiconductor pattern.

14. The method of claim 13, wherein the drain electrode and the source electrode are each in direct contact with the gate insulating layer.

15. The method of claim 14, further comprising forming an inter-insulating layer directly on the source electrode, the drain electrode, the gate insulating layer and a top surface of the second etch stop pattern.

16. The method of claim 1, wherein an uppermost surface of the second etch stop pattern is lower than an uppermost surface of the source electrode and an uppermost surface of the drain electrode.

* * * * *